United States Patent [19]
Page et al.

[11] Patent Number: 6,001,182
[45] Date of Patent: Dec. 14, 1999

[54] WAFERLESS BOAT USED AS BAFFLE DURING WAFER PROCESSING

[75] Inventors: Allen Page, Helotes; Lynn Caton, Bourne, both of Tex.

[73] Assignee: VLSI Technology, Inc., San Jose, Calif.

[21] Appl. No.: 08/870,043

[22] Filed: Jun. 5, 1997

[51] Int. Cl.[6] .................................................. C23C 16/00
[52] U.S. Cl. ............................................ 118/715; 118/725
[58] Field of Search ...................................... 118/715, 725

[56] References Cited

U.S. PATENT DOCUMENTS

| | | | |
|---|---|---|---|
| 5,020,476 | 6/1991 | Bay et al. ................................ | 118/728 |
| 5,064,367 | 11/1991 | Philipossian ............................ | 432/253 |
| 5,409,539 | 4/1995 | Turner et al. ........................... | 118/719 |
| 5,645,417 | 7/1997 | Smith ...................................... | 432/152 |
| 5,683,513 | 11/1997 | Fujimaki .................................. | 118/688 |

*Primary Examiner*—Bruce Breneman
*Assistant Examiner*—Erin Fieler
*Attorney, Agent, or Firm*—Douglas L. Weller

[57] ABSTRACT

In the course of processing integrated circuits production wafers are placed within a plurality of production boats on a platform. A first baffle boat is placed at a front end of the plurality of production boats. The first baffle boat contains a first plurality of wafers made of quartz. A second baffle boat is placed at a rear end of the plurality of production boats. The second baffle boat contains a second plurality of wafers made of quartz. The plurality of production boats, the first baffle boat and the second baffle boat are placed within a processing chamber.

18 Claims, 7 Drawing Sheets

WAFERLESS BOAT USED AS BAFFLE DURING WAFER PROCESSING

BACKGROUND

The present invention concerns processing of integrated circuits and pertains particularly to using a baffle boat during wafer processing.

In order to process silicon wafers in a horizontal diffusion oxidation furnace, a paddle is loaded with four production boats. Each production boat holds, for example, twenty-five wafers to be processed, and is, for example, made of quartz.

In addition, at each end of the paddle there is loaded an additional boat which function as baffle boat. Each baffle boat is also filled with twenty-five wafers. The baffle boats are used to help hold in the heat and diffuse gasses in order to give proper uniformity during atmospheric oxidation within the horizontal diffusion oxidation furnace. Generally, in each baffle boat one of the wafers is used as a monitor wafer to monitor the thickness of oxidation during the run.

One disadvantage to using baffle boats is that during any run through the horizontal diffusion oxidation furnace, fifty wafers are not used for production of parts. Rather forty-eight wafers are used to construct a baffle and two wafers are used to monitor the thickness of oxidation. This can increase processing costs.

While it is possible to reutilize the forty-eight wafers used to construct a baffle, after repeated cycles the wafers begin to warp and must be replaced.

SUMMARY OF THE INVENTION

In accordance with the preferred embodiment of the present invention, in the course of processing integrated circuits production wafers are placed within a plurality of production boats on a platform. For example, the production wafers are composed of silicon. The platform is, for example, a paddle.

A first baffle boat is placed at a front end of the plurality of production boats. The first baffle boat contains a first plurality of wafers made of quartz. A second baffle boat is placed at a rear end of the plurality of production boats. The second baffle boat contains a second plurality of wafers made of quartz. The plurality of production boats, the first baffle boat and the second baffle boat are placed within a processing chamber. For example, the processing chamber is a horizontal diffusion oxidation furnace.

In the preferred embodiment, the first baffle boat additionally contains a first silicon wafer used to monitor thickness of oxidation. Spacing between the first silicon wafer and adjacent quartz wafers in the first baffle boat is approximately equal to spacing between the productions wafers in the plurality of production boats. Likewise, the second baffle boat additionally contains a second silicon wafer used to monitor thickness of oxidation. Spacing between the second silicon wafer and adjacent quartz wafers in the second baffle boat is approximately equal to spacing between the productions wafers in the plurality of production boats.

The present invention provides for a cost effective way to help hold in the heat and diffuse gasses during oxidation in a horizontal diffusion oxidation furnace. The result is that proper uniformity is maintained during processing. Additionally, the use of quartz baffles obviates the need to continually replace silicon wafer which warp with repeated use.

DESCRIPTION OF THE PRIOR ART

Figure 1:
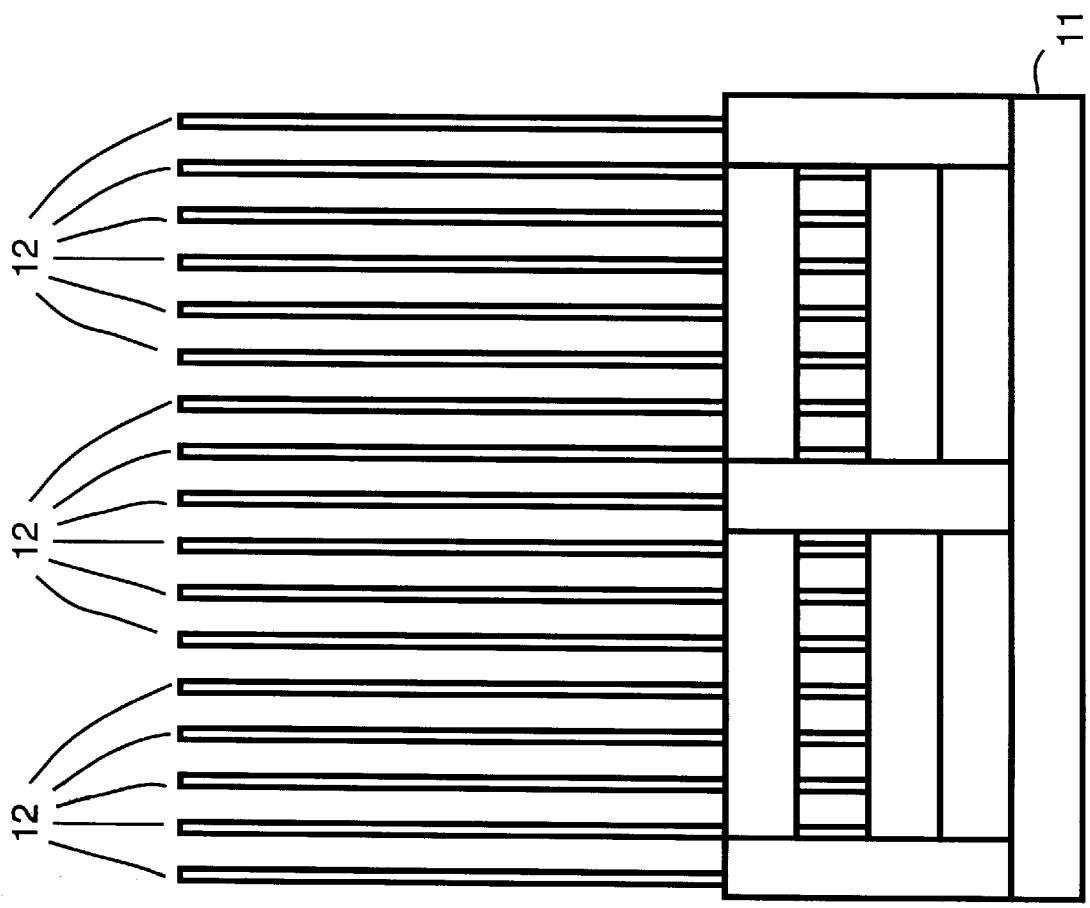
FIG. 1 shows a side view of a baffle boat in accordance with the prior art.

FIG. 1 shows a side view of a baffle boat 11 filled with wafers 12. FIG. 1 shows seventeen wafers within baffle boat 11. However, typically, there are twenty-five wafers within a baffle boat. Each of wafers 12 is, for example, a round silicon wafer which is six inches in diameter and one-eight inch in thickness. The distance between the wafers is based on uniformity requirements, for example range from ⅛ inch to ½ inch.

Figure 2:
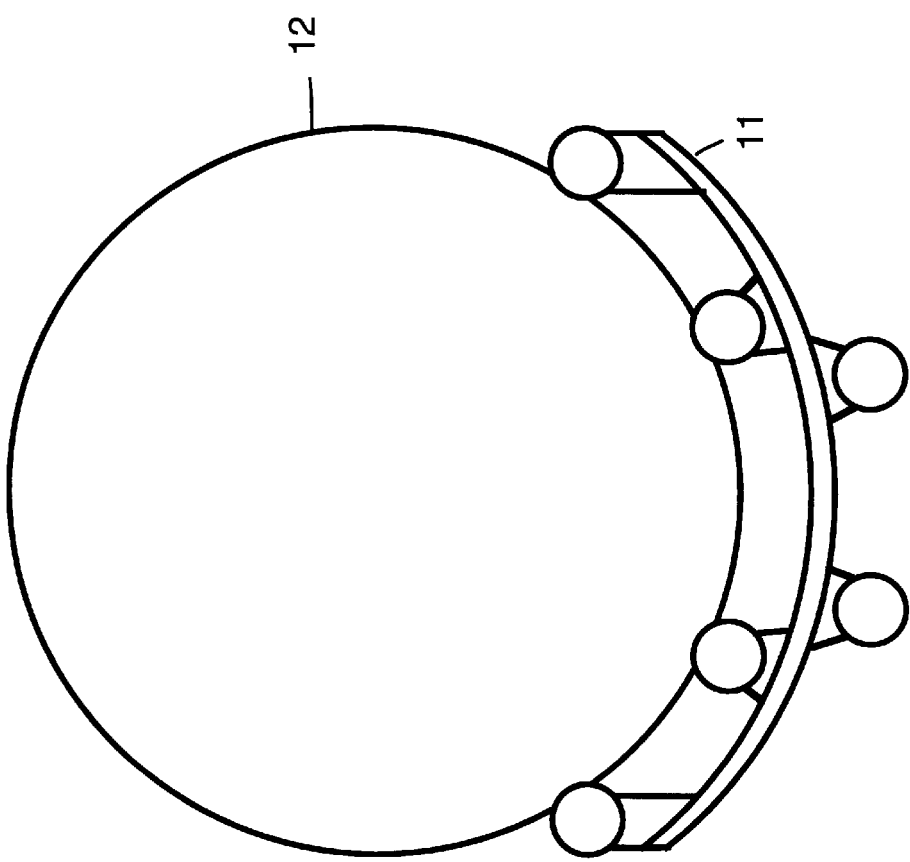
FIG. 2 shows a front view of a baffle boat in accordance with the prior art.

FIG. 2 shows a front view of baffle boat 11. The round shape of the wafers are clearly seen from FIG. 2.

Figure 3:
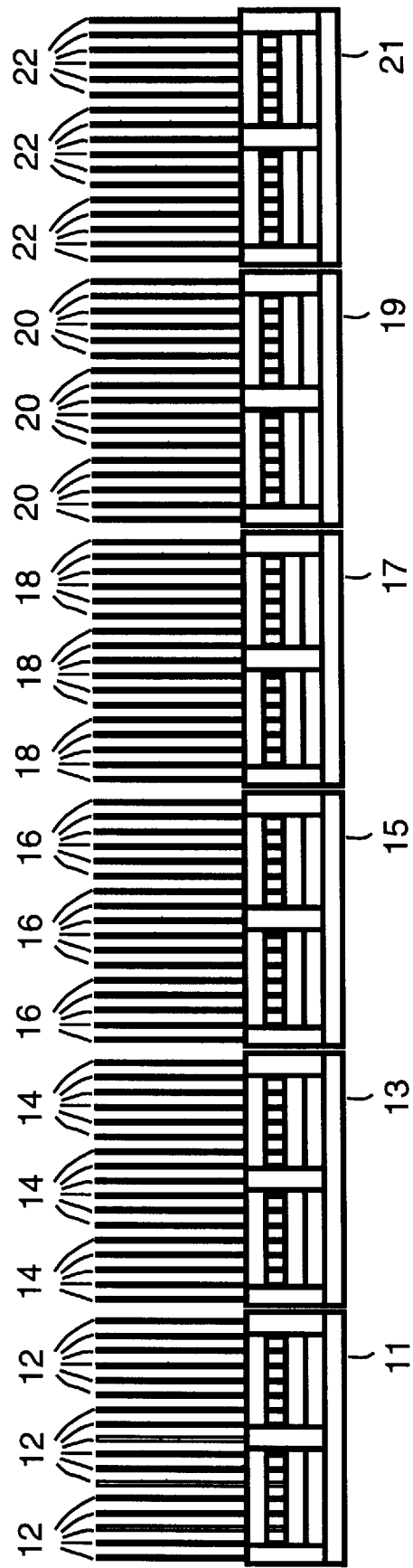
FIG. 3 shows four production boats arranged between two baffle boats in accordance with the prior art.

FIG. 3 shows production boats and two baffle boats as they are typically arranged on a paddle (not shown). A production boat 13 is filled with wafers 14. While FIG. 3 shows seventeen wafers within production boat 13, typically, there are twenty-five wafers within a production boat. Each of wafers 14 is, for example, a round silicon wafer which is six inches in diameter and one-eight inch in thickness.

A production boat 15 is filled with wafers 16. While FIG. 3 shows seventeen wafers within production boat 15, typically, there are twenty-five wafers within a production boat. Each of wafers 16 is, for example, a round silicon wafer which is six inches in diameter and one-eight inch in thickness.

A production boat 17 is filled with wafers 18. While FIG. 3 shows seventeen wafers within production boat 17, typically, there are twenty-five wafers within a production boat. Each of wafers 18 is, for example, a round silicon wafer which is six inches in diameter and one-eight inch in thickness.

A production boat 19 is filled with wafers 20. While FIG. 3 shows seventeen wafers within production boat 29, typically, there are twenty-five wafers within a production boat. Each of wafers 20 is, for example, a round silicon wafer which is six inches in diameter and one-eight inch in thickness.

FIG. 3 shows a baffle boat placed on each side of the productions boats. Baffle boat 11 with wafers 12 is on one end of the production boats. A baffle boat 21 with wafers 22 is on the other end of the production boats. While FIG. 3 shows seventeen wafers within baffle boat 21, typically, there are twenty-five wafers within a baffle boat. Each of wafers 22 is, for example, a round silicon wafer which is six inches in diameter and one-eight inch in thickness. One of the wafers in Baffle boat 11 and one of the wafers in baffle boat 21 may be used to used to monitor the thickness of

DESCRIPTION OF THE PREFERRED EMBODIMENT

Figure 4:
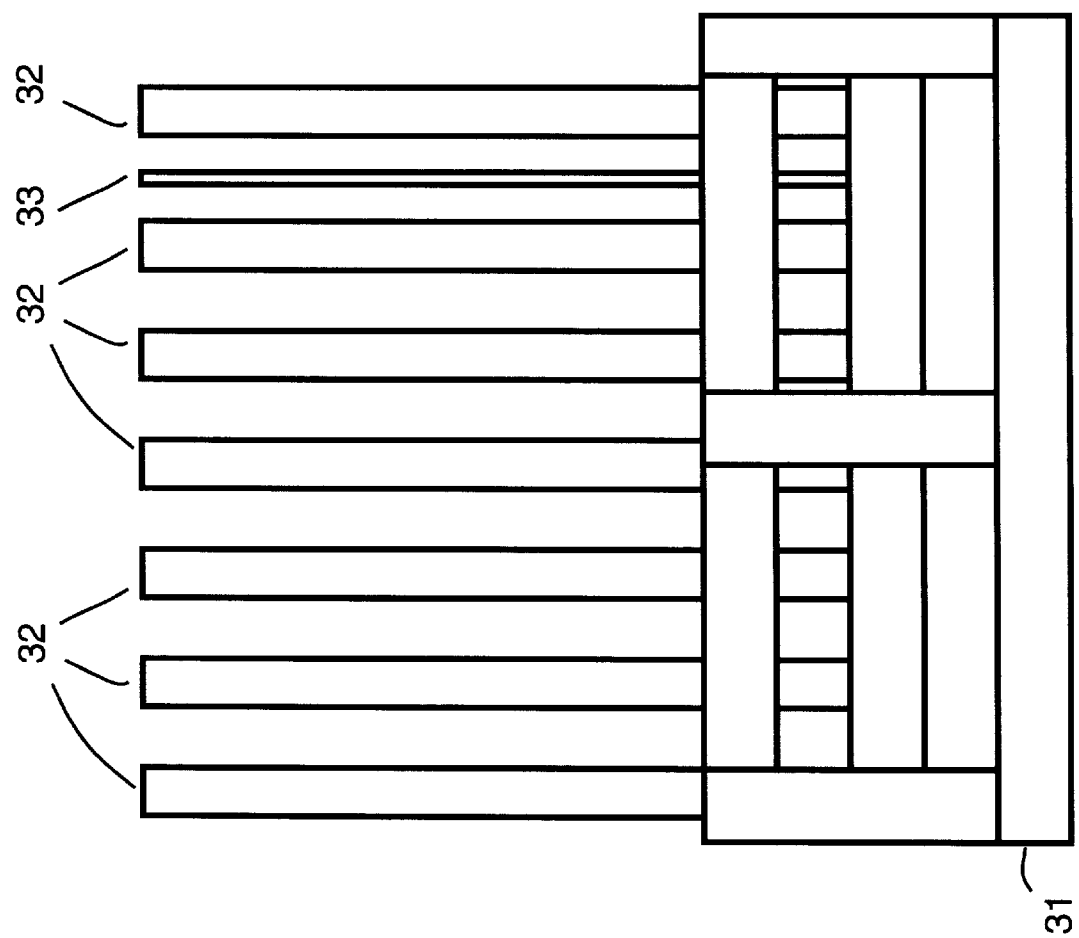
FIG. 4 shows a side view of a baffle boat in accordance with a preferred embodiment of the present invention.

FIG. 4 shows a side view of a baffle boat 31 in accordance with a preferred embodiment of the present invention. Baffle boat 31 is, for example, made of quartz. Placed within baffle boat 31 are quartz baffles 32. Each of quartz baffles 32 is, for example, a round disk. Each quartz baffle has, for example, a diameter which is the same as the diameter of production wafers. Thus when six inch diameter production wafers are used, six inch diameter quartz baffles are used. When eight inch diameter production wafers are used, eight inch diameter quartz baffles are used. Each quartz baffle is of sufficient thickness to withstand processing conditions, for example, from e.g., ⅛ inch to ½ inch thick. Quartz baffles 32 are placed within specially made slots within baffle boat 31, or are manufactured as part of baffle boat 31. While FIG. 4 shows seven quartz baffles within baffle boat 31, typically, there are four to ten quartz baffles within a baffle boat.

A wafer 33 is used to monitor the thickness of oxidation during processing, for example, during atmospheric oxidation performed within a horizontal diffusion oxidation furnace. Wafer 33 is, for example, six inches in diameter and one-eight inch in thickness. Alternatively, wafer 33 is eight inches in diameter or any other standard or non-standard wafer size. The distance between wafer 33 and the quartz baffles on either side of wafer 33 is the same distance as the spacing between wafers in a production boat (as stated above, this distance is based on uniformity requirements, and for example, typically ranges from ⅛ inch to ½ inch). Setting the spacing the same allows for close approximation of the conditions between silicon wafers being processed. This allows for accurate monitoring of the thickness of oxidation during processing, for example, during atmospheric oxidation performed within a horizontal diffusion oxidation furnace.

Figure 5:
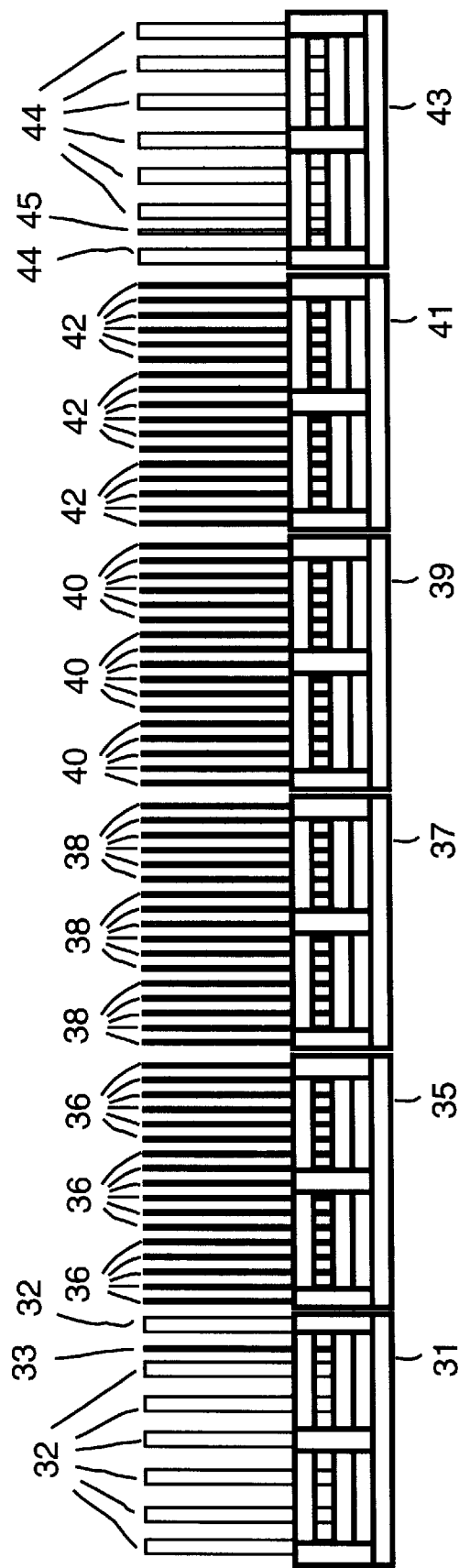
FIG. 5 shows four production boats arranged between two baffle boats in accordance with a preferred embodiment of the present invention.
Figure 6:
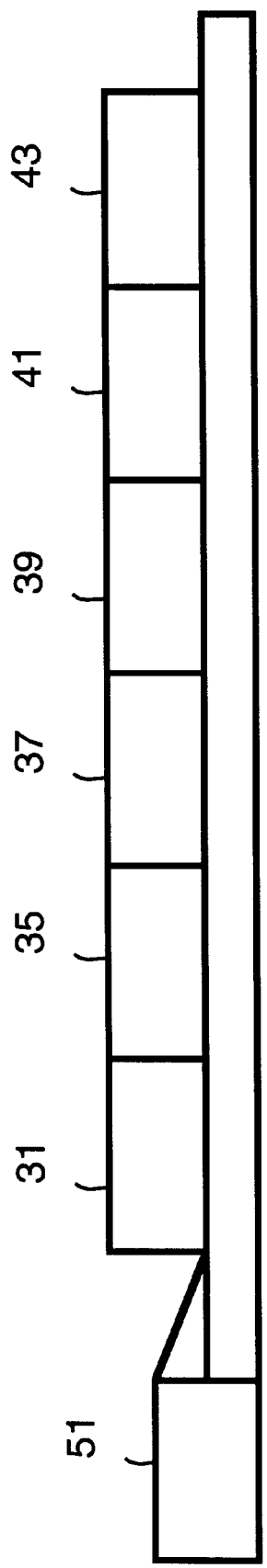
FIG. 6 is a block diagram which shows the arrangement of four production boats between two baffle boats placed on a paddle in accordance with a preferred embodiment of the present invention.

FIG. 5 shows production boats and two baffle boats as they are to be arranged on a paddle 51 (shown in FIG. 6).

A production boat 35 is filled with wafers 36. While FIG. 5 shows seventeen wafers within production boat 35, typically, there are twenty-five wafers within a production boat. Each of wafers 36 is, for example, a round silicon wafer which is six inches in diameter and one-eight inch in thickness.

A production boat 37 is filled with wafers 38. While FIG. 5 shows seventeen wafers within production boat 37, typically, there are twenty-five wafers within a production boat. Each of wafers 38 is, for example, a round silicon wafer which is six inches in diameter and one-eight inch in thickness.

A production boat 39 is filled with wafers 40. While FIG. 5 shows seventeen wafers within production boat 49, typically, there are twenty-five wafers within a production boat. Each of wafers 40 is, for example, a round silicon wafer which is six inches in diameter and one-eight inch in thickness.

A production boat 41 is filled with wafers 42. While FIG. 5 shows seventeen wafers within production boat 41, typically, there are twenty-five wafers within a production boat. Each of wafers 42 is, for example, a round silicon wafer which is six inches in diameter and one-eight inch in thickness. FIG. 5 shows a baffle boat placed on each side of the productions boats. Baffle boat 31 with quartz baffles 32 is on one end of the production boats. A quartz baffle boat 43 with quartz baffles 44 is on the other end of the production boats. While FIG. 5 shows seven quartz baffles within baffle boat 41, typically, there are four to ten quartz baffles within a baffle boat. Each of quartz baffles 44 has, for example, a diameter which is the same as the diameter of production wafers. Thus when six inch diameter production wafers are used, six inch diameter quartz baffles are used. When eight inch diameter production wafers are used, eight inch diameter quartz baffles are used. Each of quartz baffles 44 is of sufficient thickness to withstand processing conditions, for example, from e.g., ⅛ inch to ½ inch thick. Quartz baffles 44 are placed within specially made slots within baffle boat 43, or are manufactured as part of baffle boat 43.

Figure 7:
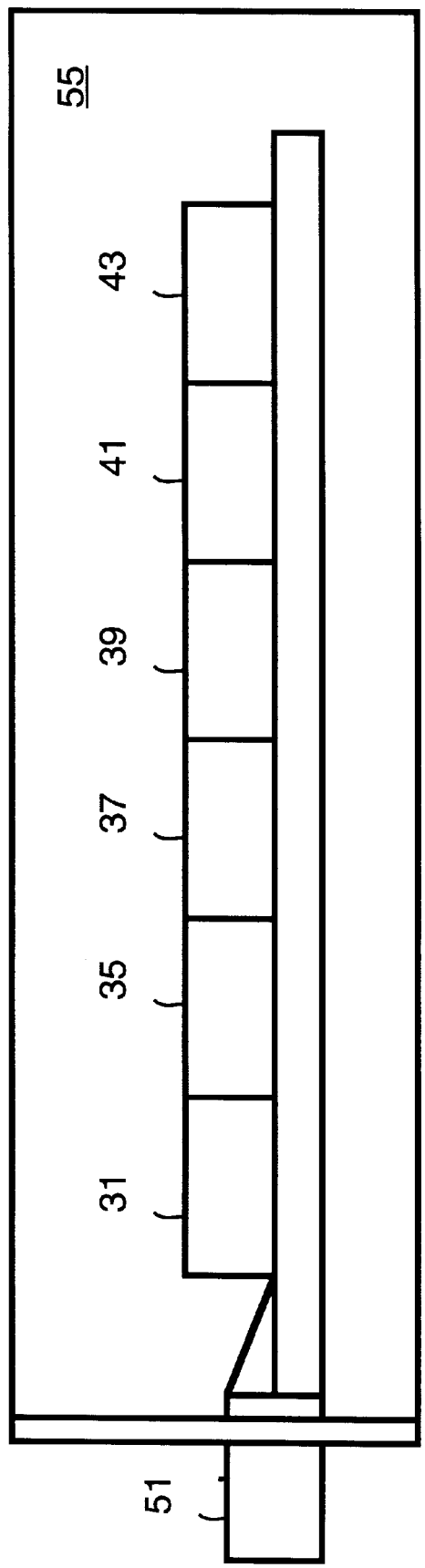
FIG. 7 is a block diagram which shows the arrangement of four production boats between two baffle boats placed on a paddle placed within a processing chamber in accordance with a preferred embodiment of the present invention.

Wafer 33 in baffle boat 31 and a wafer 45 in baffle boat 41 are used to monitor the thickness of oxidation during atmospheric oxidation within a horizontal diffusion oxidation furnace 55 (shown in FIG. 7). Wafer 45 is, for example, six inches in diameter and one-eight inch in thickness. There is approximately the same spacing between wafer 45 and the quartz baffles on either side of wafer 45 as the spacing between wafers in a production boat. By setting the spacing the same, this allows for close approximation of the conditions between silicon wafers being processed. This allows for accurate monitoring of the thickness of oxidation during processing, for example, during atmospheric oxidation performed within a horizontal diffusion oxidation furnace.

FIG. 6 shows baffle boat 31, production boat 35, production boat 37, production boat 39, production boat 41 and baffle boat 43 arranged on a paddle 51 in preparation for processing. Each of baffle boat 31, production boat 35, production boat 37, production boat 39, production boat 41 and baffle boat 43 is represented in FIG. 6 by a rectangle.

FIG. 7 shows baffle boat 31, production boat 35, production boat 37, production boat 39, production boat 41 and baffle boat 43 arranged on a paddle 51 and placed within a horizontal diffusion oxidation furnace 55. Each of baffle boat 31, production boat 35, production boat 37, production boat 39, production boat 41 and baffle boat 43 is represented in FIG. 7 by a rectangle.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method used in processing integrated circuits comprising the following steps:
    (a) placing production wafers within a plurality of production boats on a platform;
    (b) placing at a front end of the plurality of production boats a first baffle boat, the first baffle boat containing no production wafers but instead containing a first plurality of wafers made of quartz;
    (c) placing at a rear end of the plurality of production boats a second baffle boat, the second baffle boat containing no production wafers, but instead containing a second plurality of wafers made of quartz; and,
    (d) placing the plurality of production boats, the first baffle boat and the second baffle boat within a processing chamber.

2. A method as in claim 1 wherein in step (a) the production wafers are composed of silicon.

3. A method as in claim 1 wherein
in step (b) the first baffle boat additionally contains a first silicon wafer used to measure processing results; and,
in step (c) the second baffle boat additionally contains a second silicon wafer used to measure processing results.

4. A method as in claim 3 wherein:
in step (b) spacing between the first silicon wafer and adjacent quartz wafers in the first baffle boat is approximately equal to spacing between the productions wafers in the plurality of production boats.

5. A method as in claim 1 wherein the processing chamber is a horizontal diffusion oxidation furnace.

6. A method as in claim 5 wherein in step (a) the production wafers are composed of silicon.

7. A method as in claim 6 wherein
in step (b) the first baffle boat additionally contains a first silicon wafer used to monitor thickness of oxidation; and,
in step (c) the second baffle boat additionally contains a second silicon wafer used to monitor thickness of oxidation.

8. A method as in claim 7 wherein:
in step (b) spacing between the first silicon wafer and adjacent quartz wafers in the first baffle boat is approximately equal to spacing between the productions wafers in the plurality of production boats; and,
in step (c) spacing between the second silicon wafer and adjacent quartz wafers in the second baffle boat is approximately equal to spacing between the productions wafers in the plurality of production boats.

9. A method as in claim 1 wherein in step (a) the platform is a paddle.

10. A wafer processing arrangement comprising:
a platform;
a plurality of production boats arranged end to end on the platform each production boat containing production wafers;
a first baffle boat placed on the platform at a front end of the plurality of production boats, the first baffle boat containing no production wafers, but instead containing a first plurality of wafers made of quartz; and,
a second baffle boat placed on the platform at a rear end of the plurality of production boats, the second baffle boat containing no production wafers, but instead containing a second plurality of wafers made of quartz;
wherein the plurality of production boats, the first baffle boat and the second baffle boat are mobile for placement within a processing chamber.

11. A wafer processing arrangement as in claim 10 wherein the production wafers are composed of silicon.

12. A wafer processing arrangement as in claim 10 wherein the first baffle boat additionally contains a first silicon wafer used to measure processing results; and, the second baffle boat additionally contains a second silicon wafer used to measure processing results.

13. A wafer processing arrangement as in claim 12 wherein spacing between the first silicon wafer and adjacent quartz wafers in the first baffle boat is approximately equal to spacing between the productions wafers in the plurality of production boats.

14. A wafer processing arrangement as in claim 10 wherein the processing chamber is a horizontal diffusion oxidation furnace.

15. A wafer processing arrangement as in claim 14 wherein the production wafers are composed of silicon.

16. A wafer processing arrangement as in claim 15 wherein:
the first baffle boat additionally contains a first silicon wafer used to monitor thickness of oxidation; and,
the second baffle boat additionally contains a second silicon wafer used to monitor thickness of oxidation.

17. A wafer processing arrangement as in claim 16 wherein:
spacing between the first silicon wafer and adjacent quartz wafers in the first baffle boat is approximately equal to spacing between the productions wafers in the plurality of production boats; and,
spacing between the second silicon wafer and adjacent quartz wafers in the second baffle boat is approximately equal to spacing between the productions wafers in the plurality of production boats.

18. A wafer processing arrangement as in claim 10 wherein the platform is a paddle.

* * * * *